United States Patent

Bijlenga et al.

[11] Patent Number: 5,990,724
[45] Date of Patent: Nov. 23, 1999

[54] METHOD AND A DEVICE FOR DETECTING AND HANDLING SHORT-CIRCUIT PHENOMENA FOR POWER SEMICONDUCTOR DEVICES OF TURN-OFF TYPE CONNECTED IN SERIES

[75] Inventors: Bo Bijlenga, Skultuna; Peter Lundberg, Västerås, both of Sweden

[73] Assignee: Asea Brown Boveri AB, Västerås, Sweden

[21] Appl. No.: 08/921,065

[22] Filed: Aug. 29, 1997

[30] Foreign Application Priority Data

Mar. 24, 1997 [SE] Sweden ................................ 9701057

[51] Int. Cl.⁶ .................................................. H03K 17/72
[52] U.S. Cl. ........................ 327/440; 327/432; 327/482; 361/90
[58] Field of Search ...................... 327/482, 432, 327/50, 82, 58, 440, 441; 307/130; 361/88, 90, 91, 92

[56] References Cited

U.S. PATENT DOCUMENTS

| 4,084,206 | 4/1978 | Leowald et al. ........................ 361/90 |
| 4,941,079 | 7/1990 | Ooi ........................................ 363/132 |
| 5,077,651 | 12/1991 | Kobayashi et al. .................... 363/56 |
| 5,559,656 | 9/1996 | Chokhawala ........................... 361/18 |

FOREIGN PATENT DOCUMENTS

| 0 250 719 A2 | 1/1988 | European Pat. Off. . |
| 2 258 380 | 6/1974 | Germany . |
| 24 08 962 | 9/1975 | Germany . |
| 42 18 749 A1 | 12/1993 | Germany . |
| 388 735 | 3/1976 | Sweden . |
| 419 149 | 7/1981 | Sweden . |

OTHER PUBLICATIONS

Patent Abstracts of Japan, volume 9, No. 143, ED–322, 1985, Abstract of JP 60–26460 A (Hitachi Seisakusho K.K.), 1985.

Patent Abstracts of Japan, volume 9, No. 131, E–319, 1985, Abstract of JP–60–16171 A (Hitachi Seisakusho K.K.), 1985.

*Primary Examiner*—Kenneth B. Wells
*Assistant Examiner*—Minh Nguyen
*Attorney, Agent, or Firm*—Pollock, Vande Sande & Amernick

[57] ABSTRACT

In a method and apparatus used for detecting and handling a short circuit in a circuit having a plurality of power semiconductors connected in series the voltage is divided across the electrodes and each power semiconductor and the magnitude of a small proportion of the voltage is measured. The magnitude of the voltage is compared to a reference voltage at least from when the power semiconductor is turned on. The reference voltage is higher than the maximum voltage across the power semiconductor during normal operation. A short circuit is detected when the magnitude of the measured voltage exceeds the reference voltage.

10 Claims, 2 Drawing Sheets

METHOD AND A DEVICE FOR DETECTING AND HANDLING SHORT-CIRCUIT PHENOMENA FOR POWER SEMICONDUCTOR DEVICES OF TURN-OFF TYPE CONNECTED IN SERIES

BACKGROUND OF THE INVENTION

The present invention relates to a method for detecting and responding to a short-circuit occurring in a circuit having a plurality of power semiconductor devices of a turn-off type connected in series after detection of the short-circuit and to devices for accommodating such situations.

Such circuits, having power semiconductor devices connected in series, may be used in voltage-stiff converters in stations of plants for transmitting electric power through High Voltage Direct Current (HVDC), or for reactive power compensation (RPC), for converting direct voltage to alternating voltage and conversely. These converters may typically have to maintain voltage within the range 10–500 kV, although other voltages are conceivable. This makes it possible to connect numerous such power semiconductor devices in series to distribute the voltage among them since they normally each may only hold 1–5 kV. However, the invention is not restricted to such so-called high voltage converter circuits, even though such a special application will be described hereinafter for illustrating the problem upon which the present invention is based.

Examples of such power semiconductor devices of turn-off type are turn-off thyristors (GTO), MOSFETs and IGBTs (Insulated Gate Bipolar Transistors). The latter are preferable in many respects, since they combine good power handling ability with properties which make them well suited for connection in series in so-called IGBT valves in converters, for example, since they may be turned on and turned off simultaneously with high accuracy.

Short-circuit situations may, in rare cases, occur in these circuits, and it is then necessary to be able to handle these in such a way that entire IGBT valves do not break down. Such short-circuits may in such an application arise, for example, through fault of the control apparatus controlling the power semiconductor devices, which may mean that the so-called DC capacitor normally located on the direct voltage side of said station is discharged so that a short-circuit current will flow through one of the phase legs of the converter. A phase leg is formed by two IGBT valves in the same direction. Another possible short-circuit is between a phase terminal and one of the terminals of the DC capacitor or between two phase terminals, or that a ground fault occurs in a phase terminal and the DC capacitor is formed by two capacitors having a grounded midpoint.

If a short-circuit occurs in a phase leg provided with IGBT valves, the following happens: The individual IGBTs take such a voltage that the short-circuit current is limited to a value 3–10 times higher than the nominal current through the IGBT valves under normal operation. The IGBTs make this due to a current-limiting IV characteristic thereof, just as do other transistors, During the current-limiting process, the power semiconductor devices are forced to very high power dissipation. This may only exist only during a very restricted period of time, typically 10 µs.

Thus, when a short-circuit occurs, it is desirable to be able to turn off the different power semiconductor devices as soon as possible to prevent the breakdown of any of them. However, there is a problem because of variations in the drive units controlling each individual power semiconductor device, which means different fast turn-off. Also, individual variations between the different power semiconductor devices results in that they take different voltage during the current-limiting process and are turned off differently. This as well as other individual variations therebetween, results in considerable problems during the current-limiting process as well as at turn-off when a short-circuit occurs.

During both the current-limiting process and the turn-off process, the entire series connection of the power semiconductor devices has to take a certain voltage, in which the voltage to be taken by a certain power semiconductor device may through such variations be too high, where it may be considerably lower and completely acceptable across other power semiconductor devices. This means a high risk of failure of any power semiconductor device, this may, for example, happen when the voltage across a power semiconductor device gets so high that the high field strength generated thereacross leads to "avalanche", meaning that nearly all the power is concentrated at a certain point. It is also possible that the high voltage, in combination with a high short-circuit current, may lead to an overheated power semiconductor device breaking down as a consequence.

The present invention relates, according to a second aspect, to a method for detecting a short-circuit in a circuit having a plurality of power semiconductor devices of turn-off type connected in series, in which the voltage across the two electrodes of each individual power semiconductor device is measured and compared with a reference voltage value which is higher than the maximum voltage level across the electrodes at a given instant at normal operation of the power semiconductor device. Also, a short-circuit may be detected when the voltage of the power semiconductor device in question exceeds the reference voltage value. A device for enabling such a detection is also disclosed.

In such described methods, according to prior art, the on-state voltage across the power semiconductor device is detected indirectly by detecting the occurrence of a current through a diode when a power semiconductor device is turned on, in which the diode has the anode thereof connected to a low voltage (typically +15V) and the cathode is connected to the collector of the power semiconductor device. The current through the diode is expected when turned on at a time when the voltage across the electrodes of the power semiconductor device has decreased under the low voltage and the detection of a short-circuit occurs when the expected current does not occur. However, this means that the short-circuit is detected after a long delay in some situations, with the result that the voltage across the power semiconductor device in question has had time to increase too much and, at the same time the current therethrough has had time to reach a very high value before a turn-off procedure is started. Thus, there is a risk that the power semiconductor device will be destroyed as a consequence of "avalanche" or too high power dissipation therein.

SUMMARY OF THE INVENTION

A first object of the present invention is to provide a method and a device for reducing the problems of the first aspect of the present invention described above.

This object is, according to the invention, obtained by measuring the voltage across the two electrodes of each individual power semiconductor device, and a current is supplied to, or fed away from, the gate of the individual power semiconductor device depending upon the magnitude of the voltage for individual regulation of the turn-off process for each of the power semiconductor devices depending upon the voltage thereacross. A device is provided comprising means adapted to measure the voltage across the two electrodes of each individual power semiconductor device, and means adapted to independently feed current to or from the gate of each individual power semiconductor device for individually regulating the conduction thereof. Also, means is adapted to receive information about the voltage and after detection of a short-circuit control such means to individually regulate the turn-off process caused thereby for each of the power semiconductor devices.

Due to the fact that when the short-circuit situation occurs in this way, the turn-off process of each individual power semiconductor device is controlled completely individually while considering the voltage prevailing across that power semiconductor device, the voltage across an individual power semiconductor device is prevented from becoming so high that the power semiconductor device is above the short-circuit safe operating area for the given gate voltage when the power semiconductor device is in current-limiting mode. Thus, a smoothing out of the voltage distribution among the different power semiconductor devices connected in series is obtained, and good voltage division is achieved independently of the existence of a large, or small spread, of the characteristics mentioned above of the different power semiconductor devices. This avoids the power semiconductor devices having a low current-limiting level receiving a voltage above the voltage value limiting the short-circuit safe operation area. Accordingly, the turn-off of each power semiconductor device is controlled separately by ensuring feeding of current to and from the gate of the power semiconductor device depending upon the voltage across the electrodes of the power semiconductor devices, wherein this feeding may be accomplished either through a current or voltage source.

According to a preferred embodiment of the invention, the turn-off speed during the turn-off process is reduced for each individual power semiconductor device when the voltage measured thereacross increases. Retardation of the voltage increase of those power semiconductor devices where this is the largest is in this way obtained. This results in good voltage division and ensures that the instantaneous overvoltage at the turn-off process is reduced and thereby the power semiconductor device may be kept within the short-circuit safe operation area (SCSOA).

According to another preferred embodiment of the invention, when the voltage measured between the two electrodes of an individual power semiconductor device exceeds a predetermined value, it is changed to turn the power semiconductor device on by reversing the direction of the current supply to the gate of this power semiconductor device with respect to the current direction during turn-off. Turning the power semiconductor device on again in this way avoids the voltage across the electrodes rising above the highest allowed level of an individual power semiconductor device.

According to another preferred embodiment of the invention, a short-circuit situation may be detected during the turn-on process of an individual power semiconductor device which is in current limiting mode. During the turn-off process caused by the detection, the power semiconductor device is turned on when the voltage exceeds a predetermined value lower than the upper limit for the short-circuit safe operating area of the power semiconductor device. The advantages thereof appear from the above.

According to another preferred embodiment of the invention, for each individual power semiconductor device, a turn-off current is fed from the gate with a substantially constant current intensity as long as the voltage measured across the two electrodes of the power semiconductor device is below a predetermined value. When this value of the voltage is exceeded, the intensity of the turn-off current is reduced for a slower turn-off of the power semiconductor device. Thus, the voltage of each individual power semiconductor device does not rise to levels not permitted.

According to two preferred embodiments of the invention, which are further developments of the embodiment last mentioned, the reduction is achieved by a stepwise or a linear reduction in the intensity of the turn-off current when the voltage across the electrodes of the power semiconductor device increases.

According to another preferred embodiment of the invention when a short-circuit situation of one of the power semiconductor devices is detected, the turn-off process for this individual power semiconductor device is immediately started and a signal reporting the detection is sent to an apparatus in common to the power semiconductor devices. This apparatus sends signals to all the other power semiconductor devices connected in series to start their individually regulated turn-off processes. By immediately starting the turn-off process for that power semiconductor device for which the short-circuit is first detected, the shortest possible reaction time is obtained, which reduces the stress on the power semiconductor devices in the valve.

Preferred embodiments of the device according to the invention make it possible to realize the preferred embodiments of the method mentioned above according to the invention.

Another object of the present invention is to provide a method and a device according to the second aspect of the invention mentioned above, disclosing a remedy to the inconveniences discussed above regarding methods and devices according to the prior art when a short-circuit is detected.

This object is, according to the invention, obtained by a method in which for each individual power semiconductor device, the voltage across the electrodes is divided, and the magnitude of a small proportion thereof is measured and compared with the reference voltage value at least during the conducting process from a point of time for sending a turn-on order to the power semiconductor device, and by providing a device designed to enable such a method.

By measuring the voltage across the electrodes of each individual power semiconductor device in this way, that is, by measuring a small proportion thereof from the point in time of giving a turn-on order to the power semiconductor device, i.e., at high voltages across the electrodes, it will be possible to detect when a power semiconductor device is turned on into a short-circuit considerably earlier than was possible before. As a result, the short-circuit current through the power semiconductor device in question will not have time to reach high values before the turn-off process is started, which considerably reduces the risk of damaging the power semiconductor device. Also, when the power semiconductor device in question is in the on-state and a short-circuit occurs may be detected very quickly.

According to a preferred embodiment of the invention, the voltage is measured for each individual power semiconductor device and compared with a reference voltage value substantially continuously, i.e., also when the power semiconductor device is turned off. This provides permanent protection against and rapid detection of over-voltages in the circuit.

According to another preferred embodiment of the device according to the second aspect, the voltage divider has a wide band width extending from 0 Hz to a frequency region which is high with respect to the typical switching frequency of the power semiconductor device, so that the voltage divider may measure a static voltage and thereby have an absolute level as a reference, and the real voltage across each individual power semiconductor device may, at the same time, be measured with a small delay, since quick transients may thus be detected.

Further advantages of the invention will appear from the following description claims.

BRIEF DESCRIPTION OF THE DRAWINGS

With reference to the appended drawings, below follows a description of preferred embodiments of the invention cited as examples.

In the drawings.

DETAILED DESCRIPTION OF PREFERRED EMBODIMENTS OF THE INVENTION

Figure 1:
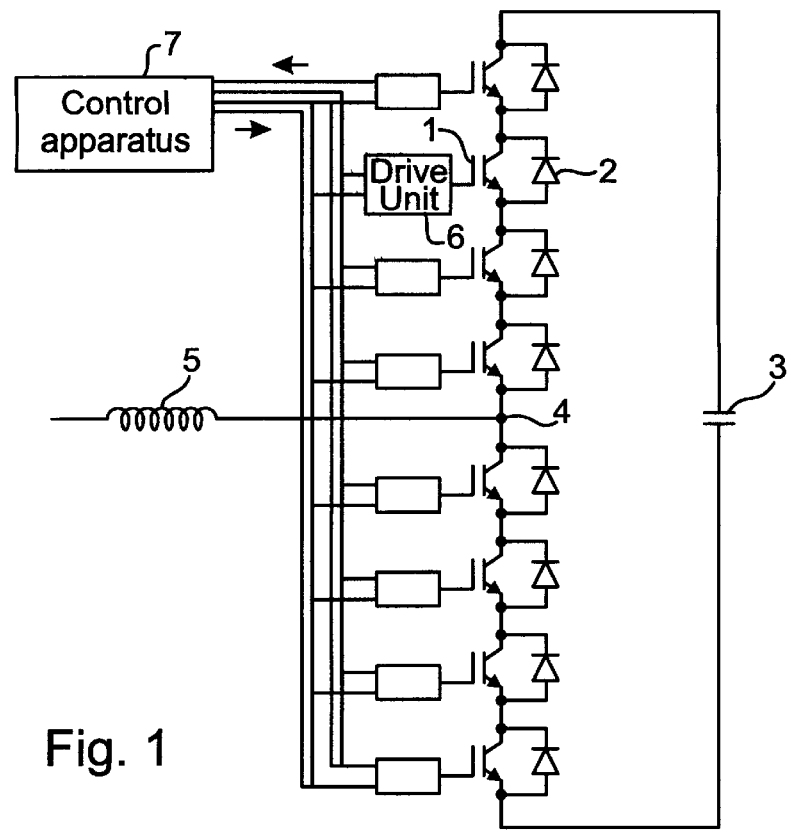
FIG. 1 is a simplified diagram illustrating a possible circuit having a plurality of power semiconductor devices connected in series, of which the problems according to the invention are applicable.

A phase leg of a high voltage converter circuit, to which the present invention is applicable, is schematically shown in FIG. 1. There are normally three phase legs having a DC capacitor 3 in common in a plant connected to a three-phase alternating current network. This comprises in a conventional way, a plurality of power semiconductor devices 1 connected in series, here in the form of IGBTs, and a so-called free-wheeling diode 2 connected in anti-parallel with each such device. The number of power semiconductor devices connected in series is, in practice, considerably higher than indicated in FIG. 1.

The series connection of power semiconductor devices is connected to a DC capacitor 3, while the phase terminal 4 between the power semiconductor devices is connected through a phase reactor 5, for example, a phase of an alternating voltage network. The power semiconductor devices with diodes arranged above the phase terminal 4 in FIG. 1 form an IGBT valve and those located thereunder form another IGBT valve.

All power semiconductor devices in an IGBT valve are turned on simultaneously through signals from a drive unit 6, each schematically indicated, so that the power semiconductor devices in the first IGBT valve are conducting when a positive potential is desired at the phase terminal 4 and the power semiconductor devices in the second IGBT valve are conducting when a negative potential is desired on the phase terminal 4.

By controlling the power semiconductor devices according to a determined pulse width modulation pattern (PWM), the direct voltage across the DC capacitor 3 may be used for generating a voltage at the phase terminal 4, the fundamental component of which is an alternating voltage having a desired amplitude, frequency and phase position. Such controlling takes place by sending control pulses to the different drive units from a control apparatus 7, which normally takes place through fiber optics.

A short-circuit may occur in a converter circuit of this type as a consequence of any of the defect situations discussed in the introduction, and it is here repeated that such a short-circuit may, for example, take place because of a defect of the control of the control apparatus 7, so the DC capacitor 3 is discharged and the current goes in the same direction through all the IGBTs 1. The invention aims to solve the problems arising in such situations in a way that avoids damaging any power semiconductor devices.

Figure 2:
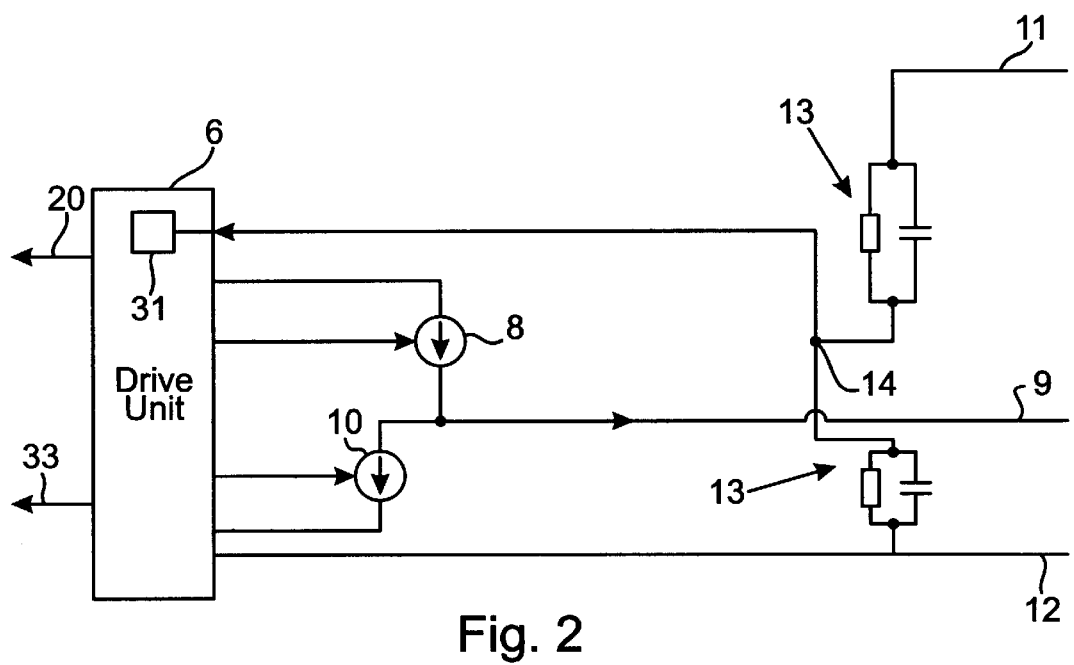
FIG. 2 is a diagram illustrating how the voltage across the electrodes of an individual power semiconductor device may be measured and how the power semiconductor device may be controlled through a drive unit.

FIG. 2 shows how a drive unit 6 for an individual power semiconductor device may connect a positive current through a voltage-limited current source 8 to the gate 9 of the power semiconductor device for turning the power semiconductor device on, or a negative current to the gate through a second voltage-limited current source 10 for turning the power semiconductor device off. The sources 8 and 10, respectively may alternatively be two controlled voltage sources each in series with a resistor, which limits the current at the time of turning or and turning off, respectively, to an appropriate value.

The invention is characterized by a voltage divider circuit 13 which is connected between the collector 11 of the IGBT and the emitter 12, the circuit being a parallel connection of a resistive and a capacitive voltage divider. Thus, this voltage divider circuit is designed with a wide band width extending from 0 Hz to a frequency region which is high with respect to the typical switching frequency of the power semiconductor device, preferably several MHz, so that it may rapidly detect quick transients. It is designed so that a small proportion of the voltage across the collector 11 and the emitter 12 is measured through tapping at the point 14 and is supplied to the drive unit 6. By knowing the magnitude of this proportion with respect to the total voltage across the power semiconductor device, the voltage last mentioned may be determined.

What happens when a short-circuit situation occurs, is detected, and is handled, will now be described with reference to FIGS. 3–5.

Figure 3:
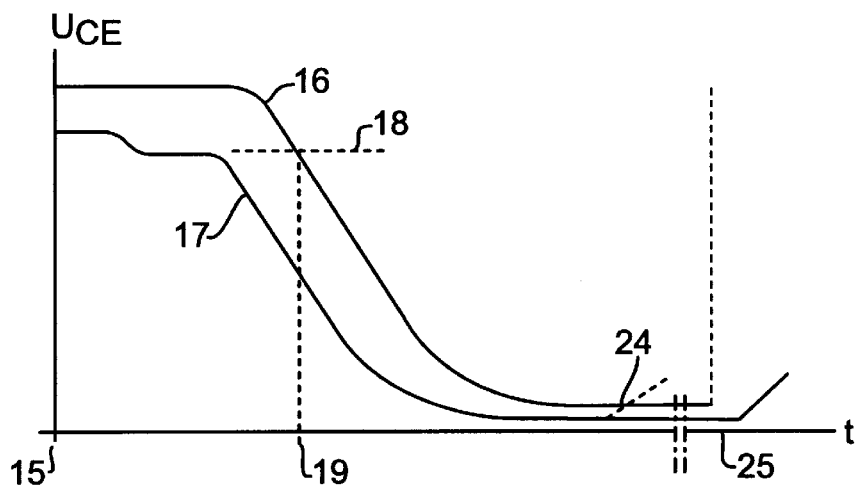
FIG. 3 is a graph illustrating how a short-circuit may be detected according to a method according to the invention.

FIG. 3 illustrates how a short-circuit is detected according to the invention. The voltage $U_{CE}$ across the two main electrodes of an individual power semiconductor device is shown as a function of time from the point of time 15 for sending a turn-on order from the control apparatus 7 to the drive unit 6 of the power semiconductor device, and further therefrom to the sources 8 and 10 for connecting the former to the gate 9.

During the starting process of the turn-on process, the power semiconductor device in question is in a current-limiting mode and it is important that the voltage across it does not increase to a value above the upper limit for the safe operation of the power semiconductor device. A reference voltage value 16 changing with time, becoming higher than the maximum voltage level 17 across the electrodes at normal operation of the power semiconductor device in a given moment, is compared in a member 31 with the voltage across the electrodes of the power semiconductor device determined by the voltage divider circuit 13.

When the power semiconductor device is turned on into a short circuit, the voltage so measured will not, as normally is the case, sink to the low on-state voltage of the power semiconductor device, but will continue approximately according to the dashed-dotted line 18, and exceed the reference voltage value at a point of time 19. When this takes place, a short-circuit is detected by the drive unit 6 and this immediately starts a turn-off process for the power semiconductor device in question by connecting the source 10 to the gate 9 and by feeding a negative turn-off current to the gate.

As indicated by the arrow 20, a signal reporting the detection is simultaneously sent to the control apparatus 7, whereupon it sends signals to all the other power semiconductor devices of the two current valves to start turn-off processes which are regulated individually so as to turn off all the power semiconductor devices connected in series.

The lines 20 and 33 preferably form a fiber optic communication between the drive unit and the control apparatus, and different codes may be used to indicate, for example, "short-circuit turn-off", "turn-on" and so on. Point 32 indicates a point in time at which the prior art short-circuit detecting device described above would detect a short-circuit.

Figure 4:
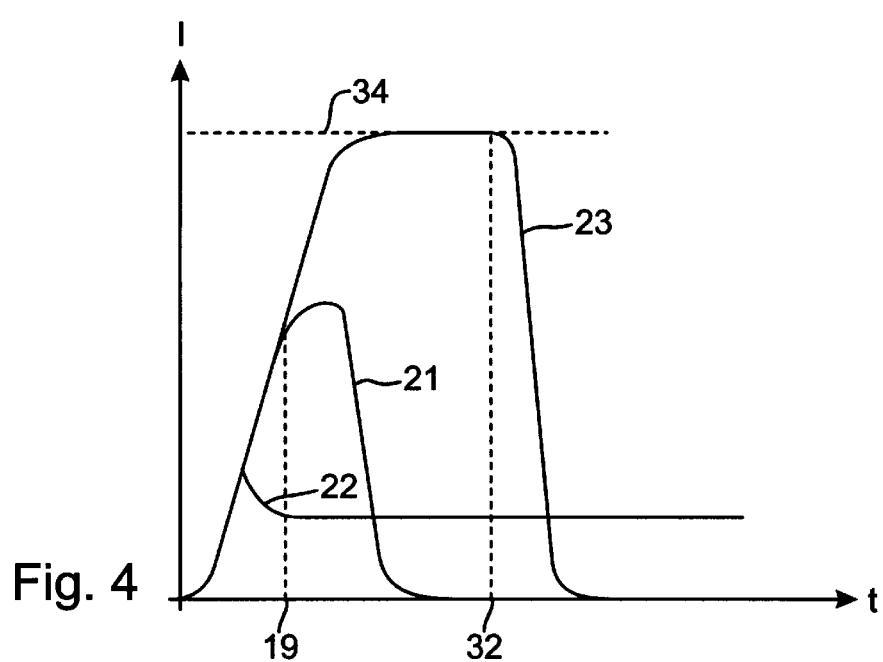
FIG. 4 is a graph illustrating a comparison of the development of the current through a power semiconductor device after a short-circuit when detecting a short-circuit according to prior art and according to a method according to the present invention.

FIG. 4 illustrates how the current 21 through the power semiconductor device in question is developed over time and how it reaches a maximum value and thereafter decreases as of the point of time 19 when the turn-off process is started. Graph 22 illustrates the development of the current at normal turn-on of the power semiconductor device, while graph 23 illustrates how the current through the power semiconductor device would develop should the prior art method discussed in the introduction be used for detecting the short-circuit and the short-circuit be detected at the point of time 32. The typical current integral value to which the power semiconductor device is exposed during the short-circuit process may, through the method according to the invention, be a fraction of the case according to the prior art method according to the graph 23. A current-limiting level of the power semiconductor device is illustrated by the dashed line 34.

A short-circuit occurring when a power semiconductor device is turned on is detected by the increase of voltage across the electrodes of the power semiconductor device at point 24. This is also illustrated in FIG. 3. Point 25 indicates a point in time for sending a turn-off order to the power semiconductor device at normal operation.

Figure 5:
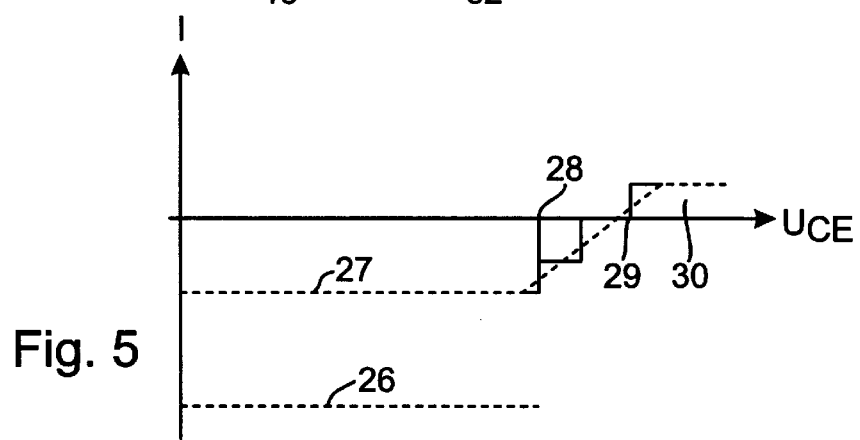
FIG. 5 is a graph illustrating how the turn-off process of an individual power semiconductor device after detection of a short-circuit may be controlled depending upon the voltage across the electrodes of the power semiconductor device according to a method according to the invention.

FIG. 5 shows how the turn-off process according to the invention is carried out for each individual power semiconductor device independently of the rest of the power semiconductor devices. The negative turn-off current fed to the gate 9 of the power semiconductor device at normal turn-off is illustrated by dashed line 26. This current preferably has a comparatively high intensity, so that the turn-off will be fast in order to obtain low turn-off losses, which however results in a comparatively high voltage overshoot which is not dramatic due to the comparatively low current through the power semiconductor device. However, when a short-circuit occurs, it is not possible to carry out a turn-off just as fast, but the negative turn-off current 27 fed to the gate of the power semiconductor device has to have a lower intensity, since no high voltage overshoot is acceptable as a consequence of the comparatively high short-circuit current flowing through the power semiconductor device.

The voltage across the electrodes of the individual power semiconductor device is measured continuously during the turn-off process by the voltage divider circuit 13. Should this voltage exceed a certain level 28, the turn-off speed will be reduced by reducing the intensity of the negative current fed to the gate of the power semiconductor device.

Two possible alternatives to reduce the intensity of the turn-off current are indicated in FIG. 5, a stepwise one and a linear one. Should the voltage across the two electrodes of the power semiconductor device exceed the predetermined value 29, which is below the upper limit 30 of the short-circuit safe operation area of the power semiconductor device, the direction of the feeding current to the gate of the power semiconductor device will be reversed and it is turned on again to reduce the voltage across the electrodes to an acceptable value, whereupon the turn-off may be continued. Through such individual control of the turn-off process of each of the power semiconductor devices connected in series, differences of voltages may be smoothed out and good voltage distribution obtained during the entire turn-off process, so that any power semiconductor device break down as a consequence of "avalanche" or high heat dissipation may be avoided. The voltage level 28 should be chosen to correspond to the fact that the voltage across the power semiconductor device in question exceeds the average voltage across the power semiconductor devices connected in series by a certain margin, the turn-off process may be slowed down but not before the power semiconductor device in question has a voltage thereacross clearly exceeding said average voltage. The stepwise method may be simplified so that it is changed to zero voltage directly at point 28.

The invention is not in any way restricted to the preferred embodiments described above, but several possible modifications thereof, apart from those already mentioned above, will be apparent to one skilled in the art without departing from the basic idea of the invention, such as defined in the claims.

The high voltage converter circuit shown in FIG. 1 is only one conceivable application of the present invention, and many other circuits having power semiconductor devices connected in series could benefit from the present invention to handle short-circuit situations.

The term "short-circuit situation" is chosen to indicate that the invention relates to problems arising in the power semiconductor devices connected in series as a consequence of any short-circuit irrespective of where it occurs.

We claim:

1. A method for handling a detected short-circuit situation in a circuit having a plurality of power semiconductors of turn-off type connected in series comprising the steps of:

receiving a signal that a short-circuit has been detected;

measuring a voltage across both electrodes of each power semiconductor; and supplying current to or away from a gate of each said power semiconductor dependent on a magnitude of said voltage whereby individual regulation of a turn-off process for each power semiconductor is achieved.

2. The method of claim 1 further comprising the step of reducing a turn-off speed of each power semiconductor when said voltage increases.

3. The method of claim 1 further comprising the step of reversing the direction of said current to said gate, with respect to a direction during turn-off, when said voltage exceeds a first pre-determined value.

4. The method of claim 3 wherein said short-circuit is detected during a turn-on process of said power semiconductor and said power semiconductor is turned off in response, further comprising the step of turning said power semiconductor on when said voltage exceeds said pre-determined value which is lower than a upper limit for a short-circuit safe operating area of said power semiconductor.

5. The method of claim 1 further comprising the steps of,
feeding a turn-off current from said gate of said power semiconductor as long as said voltage is below a second pre-determined value, said turn-off current having a substantially constant current intensity; and
reducing said current intensity when said voltage exceeds said second pre-determined value whereby a slower turn-off of said power semiconductor is achieved.

6. The method of claim 5 wherein said current intensity is reduced step-wise.

7. The method of claim 5 wherein said current intensity is reduced substantially linearly with respect to the rise of said voltage.

8. The method of claim 1 further comprising the steps of
starting said turn-off process immediately upon detection of the short circuit;
reporting said detection to an apparatus connected in common to all said power semiconductors;
sending a signal from said apparatus to all other power semiconductors to start turn-off processes which are individually regulated.

9. An apparatus for handling a short-circuit situation in a circuit having a plurality of semiconductor devices of turn-off type connected in series comprising:
means for measuring a voltage across electrodes of each said semiconductor device;
means for independently feeding current to each said semiconductor device, whereby individual regulation of conduction of each said semiconductor device is achieved;
a control member communicating with said means for measuring and said means for feeding, said control member controlling said means for feeding based on information received from said means for measuring, wherein said control member is adapted to control said means for feeding to reduce the turn-off speed for each power semiconductor when said voltage increases.

10. An apparatus for handling a short-circuit situation in a circuit having a plurality of semiconductor devices of turn-off type connected in series comprising:
means for measuring a voltage across electrodes of each said semiconductor device;
means for independently feeding current to each said semiconductor device, whereby individual regulation of conduction of each said semiconductor device is achieved;
a control member communicating with said means for measuring and said means for feeding, said control member controlling said means for feeding based on information received from said means for measuring, and
means for comparing said voltage to a reference voltage, said means for comparing communicating with said control member and said means for measuring wherein said control member is adapted to control said means for feeding to turn on said semiconductor device by reversing the direction of the current, with respect to the direction at turn-off, fed to a gate of said semiconductor device when said voltage exceeds a pre-determined value.

* * * * *